(12) United States Patent
Zhou et al.

(10) Patent No.: US 10,211,851 B2
(45) Date of Patent: Feb. 19, 2019

(54) METHOD AND SYSTEM FOR COMPRESSING DATA FROM SMART METER

(71) Applicant: Hefei University of Technology, Hefei, Anhui (CN)

(72) Inventors: Kaile Zhou, Anhui (CN); Lulu Wen, Anhui (CN); Shanlin Yang, Anhui (CN); Xinhui Lu, Anhui (CN); Zhen Shao, Anhui (CN); Li Sun, Anhui (CN)

(73) Assignee: Hefei University of Technology, Hefei (CN)

( * ) Notice: Subject to any disclaimer, the term of this patent is extended or adjusted under 35 U.S.C. 154(b) by 0 days.

(21) Appl. No.: 15/947,857

(22) Filed: Apr. 8, 2018

(65) Prior Publication Data

US 2018/0294819 A1 Oct. 11, 2018

(30) Foreign Application Priority Data

Apr. 10, 2017 (CN) .......................... 2017 1 0230240

(51) Int. Cl.
  *H03M 7/00* (2006.01)
  *H03M 7/30* (2006.01)
  (Continued)

(52) U.S. Cl.
  CPC .......... *H03M 7/3084* (2013.01); *G01D 4/002* (2013.01); *G01R 22/063* (2013.01); *H04L 69/04* (2013.01)

(58) Field of Classification Search
  CPC .. G01D 4/002; Y02B 70/3266; Y02B 90/241; Y02B 90/246; Y02B 90/244;
  (Continued)

(56) References Cited

U.S. PATENT DOCUMENTS

| 2002/0145537 A1* | 10/2002 | Mueller | H04Q 9/00 340/870.02 |
| 2011/0004764 A1* | 1/2011 | Stuber | G01D 4/004 713/176 |

(Continued)

FOREIGN PATENT DOCUMENTS

| CN | 10269557 A | 9/2012 |
| CN | 103973761 A | 8/2014 |

(Continued)

*Primary Examiner* — Linh V Nguyen
(74) *Attorney, Agent, or Firm* — Wayne & Ken, LLC; Tony Hom

(57) ABSTRACT

The present invention relates to a method and a system for compressing data from a smart meter. The method comprises: LZ-encoding electricity load data collected by the smart meter whenever the smart meter collects the electricity load data; storing the LZ-encoded electricity load data in a temporary database through a smart grid communication channel; reading the electricity load data from the temporary database every preset second duration, wherein the read electricity load data is electricity load data stored in the temporary database within the second duration before a corresponding reading time point; and LZ-decoding the read electricity load data, SAX-compressing the LZ-decoded electricity load data, and storing the SAX-compressed electricity load data in a data center. The present invention has high compression rate, reduces the transmission burden for communication lines and storage burden for the data center, and improves the efficiency of smart electricity data analysis and mining.

4 Claims, 2 Drawing Sheets

(51) Int. Cl.
*G01R 22/06* (2006.01)
*G01D 4/00* (2006.01)
*H04L 29/06* (2006.01)

(58) Field of Classification Search
CPC ... Y02B 90/2607; Y04S 20/242; Y04S 20/32; Y04S 20/42; G01R 21/133; G01R 22/063; G01R 11/25; G01R 25/00; G01R 31/086; G01R 31/40; G01R 21/00; G01R 19/16547; G01R 19/2513; G01R 22/10; G01R 15/00; G01R 21/08; G01R 21/1333; G01R 22/00

See application file for complete search history.

(56) References Cited

U.S. PATENT DOCUMENTS

| | | | | |
|---|---|---|---|---|
| 2011/0295912 | A1* | 12/2011 | Sanchez Loureda | G01D 3/032 707/812 |
| 2012/0041696 | A1* | 2/2012 | Sanderford, Jr. | G01D 4/004 702/62 |
| 2012/0059528 | A1* | 3/2012 | Umesawa | G01D 4/002 700/295 |
| 2012/0316689 | A1* | 12/2012 | Boardman | H02J 13/0079 700/292 |
| 2012/0316691 | A1* | 12/2012 | Boardman | H02J 3/26 700/293 |
| 2013/0198245 | A1* | 8/2013 | Kagan | H04L 67/06 707/812 |
| 2014/0157370 | A1* | 6/2014 | Plattner | G06F 21/6245 726/4 |
| 2014/0232553 | A1* | 8/2014 | Venkatraman | H04Q 9/00 340/870.07 |
| 2015/0331025 | A1* | 11/2015 | Arashima | G01R 15/142 702/62 |
| 2016/0103163 | A1* | 4/2016 | Schamber | G01R 22/10 702/61 |

FOREIGN PATENT DOCUMENTS

| | | |
|---|---|---|
| CN | 104407189 A | 3/2015 |
| CN | 105718218 A | 6/2016 |
| JP | 8-327502 A | 12/1996 |

\* cited by examiner

METHOD AND SYSTEM FOR COMPRESSING DATA FROM SMART METER

TECHNICAL FIELD

The present invention relates to the technical field of data processing, and in particular to a method and a system for compressing data from smart meter.

BACKGROUND OF THE INVENTION

With the development of power systems, smart grid has become the tendency of the future power industry development, and smart meters are increasingly deployed. At present, most smart meters can record electricity consumption information of users every 15 minutes. Moreover, with the continuous development of related technologies, the smart meters can record electricity consumption information at a higher frequency to form high-dimensional time series data, which will undoubtedly bring huge transmission burden to communication lines and also will bring huge storage cost to a data center. In addition, it will be very difficult to analyze and apply such high-dimensional big data from the smart meters, such as electricity load prediction, abnormal electricity consumption detection, demand side management and etc. Therefore, the compression of data from the smart meters is of great importance to reduce the transmission burden for communication lines and storage burden for the data center and to improve the efficiency of smart electricity data analysis and service.

However, at present, there is no compression method or system that can have high compression rate to relieve the data transmission burden and reduce storage cost, as well as improve the efficiency of big data analysis and mining.

SUMMARY OF THE INVENTION

(I) Technical Problems to be Solved

The present invention provides a method and a system for compressing data from a smart meter, which can solve the technical problem in the prior art that the transmission burden for data cannot be relieved and the compression rate is low.

(II) Technical Solutions

In a first aspect, the present invention provides a method for compressing data from a smart meter, including steps of:
LZ-encoding electricity load data whenever the data is collected by the smart meter, wherein the smart meter collects the electricity load data every preset first duration;
storing the LZ-encoded electricity load data in a temporary database through a smart grid communication channel;
reading the electricity load data from the temporary database every preset second duration, wherein the read electricity load data is electricity load data stored in the temporary database within the second duration before a corresponding reading time point; and
LZ-decoding the read electricity load data, SAX-compressing the LZ-decoded electricity load data, and storing the SAX-compressed electricity load data in a data center.

Optionally, the second duration is longer than or equal to the first duration.

Optionally, after LZ-decoding the read electricity load data, the method further includes a step of deleting the electricity load data stored in the temporary database within the second duration before the corresponding reading time point.

Optionally, SAX-compressing the LZ-decoded electricity load data includes steps of: determining a level of the LZ-decoded electricity load data based on a preset electricity load grading standard, and assigning a character corresponding to the determined level to the LZ-decoded electricity load data.

Optionally, the electricity load grading standard is determined according to a statistical quantile under the normal distribution of electricity loads.

Optionally, before determining a level of the LZ-decoded electricity load data based on a preset electricity load grading standard, the method further includes steps of: dividing the second duration corresponding to the LZ-decoded electricity load data from a smart meter into a number of intervals, calculating a mean value of the electricity load data at each time point in an interval, and using the mean value as the electricity load data in this interval.

In a second aspect, the present invention provides a system for compressing data from a smart meter, including:
an LZ-encoding module configured to LZ-encode electricity load data whenever the data is collected by the smart meter, wherein the smart meter collects the electricity load data every preset first duration;
a storage module configured to store the LZ-encoded electricity load data in a temporary database through a smart grid communication channel;
a read module configured to read the electricity load data from the temporary database every preset second duration, wherein the read electricity load data is electricity load data stored in the temporary database within the second duration before a corresponding reading time point; and
a SAX compression module configured to LZ-decode the read electricity load data, SAX-compress the LZ-decoded electricity load data, and store the SAX-compressed electricity load data in a data center.

Optionally, the second duration is longer than or equal to the first duration.

Optionally, after LZ-decoding the read electricity load data, the read module is further configured to delete the electricity load data stored in the temporary database within the second duration before the corresponding reading time point.

Optionally, the SAX compression module is specifically configured to determine a level of the LZ-decoded electricity load data based on a preset electricity load grading standard, and assign a character corresponding to the determined level to the LZ-decoded electricity load data.

(III) Beneficial Effects

By the method and system for compressing data from a smart meter provided by the present invention, firstly, the electricity load data is LZ-compressed, the compressed data is sent to the temporary database, the data in the temporary database is decoded and SAX-compressed and the compressed data is stored in the data center to achieve the electricity load data compression. The data is LZ-compressed in real time before it is sent to the temporary database, so that the initial compression is achieved and the data transmission burden can be relieved. The data stored in the temporary database is SAX-compressed after being decoded, which can be used as a lossy compression method to compress the data in real time before transmitting the data to the data center. The present invention has high compression rate, reduces the transmission burden for communication lines and storage burden for the data center, and improves the efficiency of smart electricity data analysis and mining.

BRIEF DESCRIPTION OF THE DRAWINGS

In order to more clearly illustrate the embodiments of the present invention or the technical solutions in the prior art, the accompanying drawings to be used in the embodiments or the existing technical description will be briefly described below. Obviously, the drawings in the following description are only a part of the embodiments of the present invention, and those of ordinary skill in the art may also obtain other drawings based on these drawings without paying creative effort.

DETAILED DESCRIPTION OF THE INVENTION

The technical solution in the embodiments of the present invention will be clearly and completely described as below with reference to the accompanying drawings in the embodiments of the present invention. Obviously, the described embodiments are only a part of, not all of, the embodiments of the present invention. All other embodiments obtained by a person of ordinary skill in the art based on the embodiments of the present invention without paying creative effort shall fall into the protection scope of the present invention.

Figure 1:
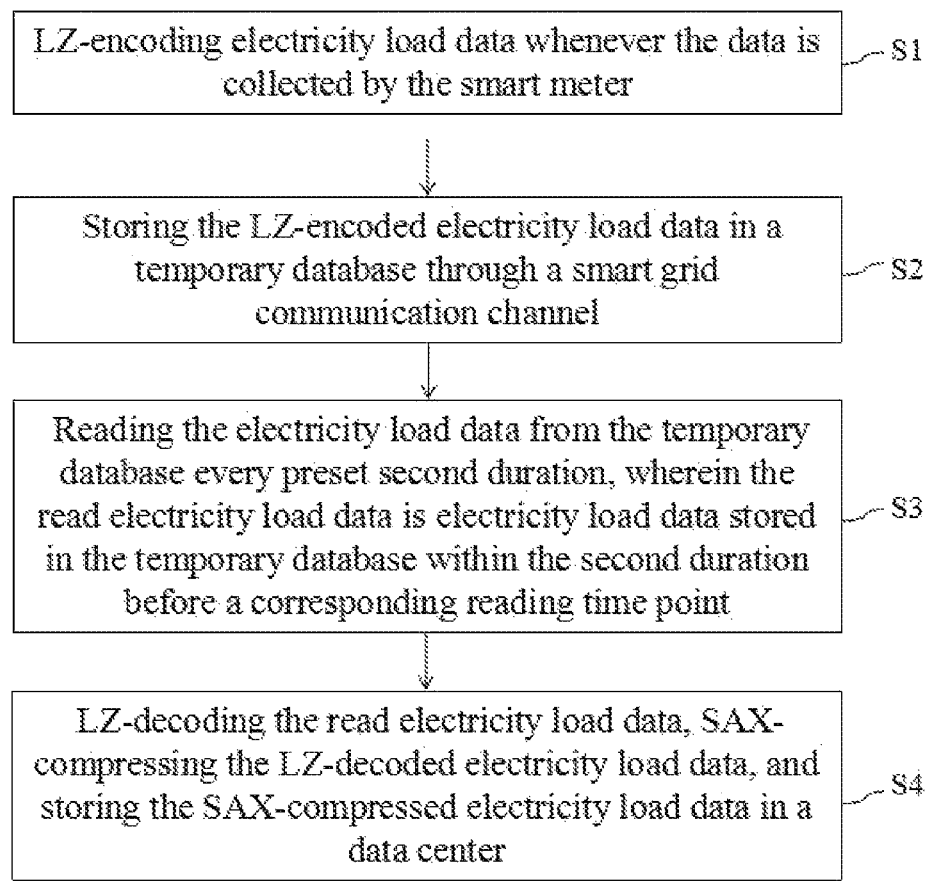
FIG. 1 shows a schematic flowchart of a method for compressing data from a smart meter in an embodiment of the present invention.

In a first aspect, the present invention provides a method for compressing data from a smart meter. As shown in FIG. 1, the method includes the following steps.

S1. Electricity load data is LZ-encoded whenever the data is collected by the smart meter, wherein the smart meter collects the electricity load data every preset first duration.

It may be understood that an LZ-encoding algorithm is a compression algorithm which is more efficient than the Huffman encoding algorithm and faster than the arithmetic coding algorithm. Moreover, it is simpler to decode and can achieve lossless compression. Specifically, the LZ-encoding can be carried out by a dictionary of the LZ-encoding algorithm embedded in the smart meter.

It may be understood that the first duration, for example, is 15 minutes. That is, the smart meter will collect the electricity load data of a certain user every 15 minutes, and can record the data collected at every time as $s_i(i=1\ldots n)$ where $s_i$ represents ith data point collected by the smart meter and n represents the total data points collected by the smart meter.

S2. The LZ-encoded electricity load data in a temporary database is stored through a smart grid communication channel.

S3. The electricity load data is read from the temporary database every preset second duration, wherein the read electricity load data is electricity load data stored in the temporary database within the second duration before a corresponding reading time point.

For example, the data in the temporary database is read every 24 hours, and the read data is electricity load data stored in the temporary database during the period between the current reading time point and the last reading time point.

S4. The read electricity load data is LZ-decoded, the LZ-decoded electricity load data is SAX-compressed, and the SAX-compressed electricity load data is stored in a data center.

It may be understood that the so-called LZ-decoding is to restore the read electricity load data to the data before LZ-decoding.

It may be understood that the SAX-compression is a lossy compression method that is simpler to implement and has high compression rate.

The method for compressing data from the smart meter provided by the present invention includes the steps of firstly LZ-compressing the electricity load data, sending the compressed data to the temporary database, decoding and SAX-compressing the data in the temporary database and storing the compressed data in the data center to achieve the electricity load data compression. The data is LZ-compressed before it is sent to the temporary database, so that the initial compression is achieved and the data transmission burden can be relieved. The data stored in the temporary database is SAX-compressed after being decoded, which can be used as a lossy compression method to compress the data in real time before transmitting the data to the data center. The present invention has high compression rate, reduces the transmission burden for communication lines and storage burden for the data center, and improves the efficiency of smart electricity data analysis and mining.

In a specific implementation, the second duration may be longer than or equal to the first duration, e.g., when the first duration is 15 minutes, the second duration is 24 hours.

In a specific implementation, in order to save the storage space of the temporary database, the electricity load data stored in the temporary database within the second duration before the corresponding reading time point may be deleted after LZ-decoding the read electricity load data.

In a specific implementation, the specific step of SAX-compressing the LZ-decoded electricity load data in S4 includes the steps of: determining a level of the LZ-decoded electricity load data based on a preset electricity load grading standard, and assigning a character corresponding to the determined level to the LZ-decoded electricity load data.

For example, the second duration corresponding to the decoded reading data from a certain smart meter is divided into p third intervals, a mean value of the electricity load data at each time point in the third intervals is calculated, $\overline{S}'_p$ represents the electricity load data of the pth third interval. The amplitude of the electricity load data is divided into q−1 segments and can be expressed as $Y=\{y_1, y_2, \ldots y_q\}$. Each segment corresponds to one level, and each level corresponds to one character in the $A=\{a_1, a_2, \ldots a_q\}$. For example, if $y_r < \overline{S}'_p \leq y_{r+1}$, the character $a_{r+1}(r \in [1, q-1])$ is assigned to $\overline{S}'_p$, wherein the $y_r$ and $y_{r+1}$ are upper and lower limits of the r th segment of the amplitude.

In a specific implementation, the electricity load grading standard can be determined according to a statistical quantile under the normal distribution of electricity loads.

Of course, before determining a level of the LZ-decoded electricity load data, the second duration corresponding to the LZ-decoded electricity load data from a smart meter can also be divided into a number of intervals, a mean value of the electricity load data at each time point in an interval is calculated, and the mean value is used as the electricity load data in this interval.

The standard for dividing the intervals can be set as needed, e.g., it is assumed that the second duration is 24 hours, and the second duration can be divided into 24:00-6:00, 6:00-9:00, 9:00-18:00 and 18:00-24:00 according to the user's electricity consumption habit.

Figure 2:
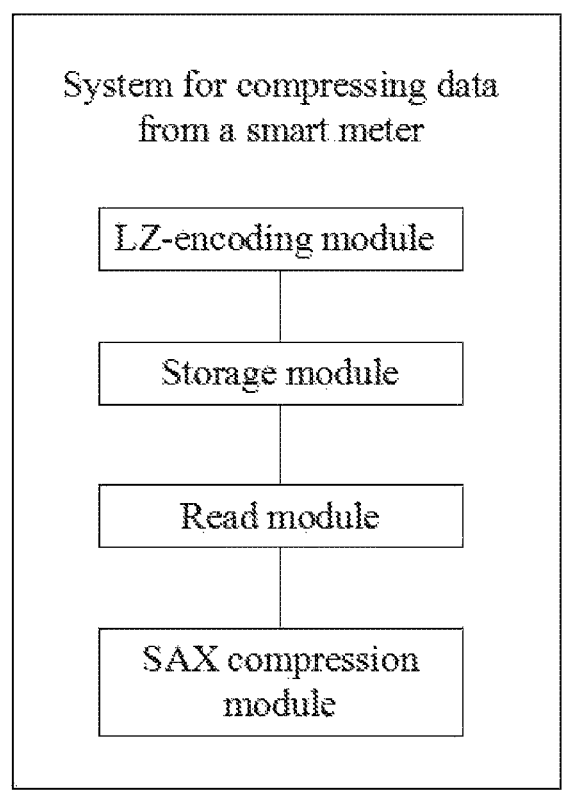
FIG. 2 shows a structural block diagram of a system for compressing data from a smart meter in an embodiment of the present invention.

In a second aspect, the present invention further provides a system for compressing data from a smart meter. As shown in FIG. 2, the system includes:

an LZ-encoding module configured to LZ-encode electricity load data whenever the data is collected by the smart meter, wherein the smart meter collects the electricity load data every preset first duration;

a storage module configured to store the LZ-encoded electricity load data in a temporary database through a smart grid communication channel;

a read module configured to read the electricity load data from the temporary database every preset second duration, wherein the read electricity load data is electricity load data stored in the temporary database within the second duration before a corresponding reading time point; and a SAX compression module configured to LZ-decode the read electricity load data, SAX-compress the LZ-decoded electricity load data, and store the SAX-compressed electricity load data in a data center.

Optionally, the second duration is longer than or equal to the first duration.

Optionally, after LZ-decoding the read electricity load data, the read module is further configured to delete the electricity load data stored in the temporary database within the second duration before the corresponding reading time point.

Optionally, the SAX compression module is specifically configured to determine a level of the LZ-decoded electricity load data based on a preset electricity load grading standard, and assign a character corresponding to the determined level to the LZ-decoded electricity load data.

The system for compressing data from a smart meter provided by the present invention is a functional framework module for the method for compressing data from a smart meter provided by the present invention, and the explanations for its relevant contents, examples, beneficial effects and other contents can refer to corresponding parts of the method for compressing data from a smart meter provided by the present invention, and the details will not be repeated herein.

In summary, by the method and system for compressing data from the smart meter provided by the present invention, firstly, the electricity load data is LZ-compressed, the compressed data is sent to the temporary database, the data in the temporary database is decoded and SAX-compressed and the compressed data is stored in the data center to achieve the electricity load data compression. The data is LZ-compressed in real time before it is sent to the temporary database, so that the initial compression is achieved and the data transmission burden can be relieved. The data stored in the temporary database is SAX-compressed after being decoded, which is used as a lossy compression method that improves compression rate, thus to reduce the storage cost of the data center and improve the efficiency of smart meter data analysis and mining.

Finally, it should be noted that the above embodiments are only used for describing the technical solutions of the present invention, but not for limiting the present invention. Although the embodiments of the present invention have been described in detail with reference to the foregoing embodiments, it will be appreciated by a person of ordinary skill in the art that modifications may be done to the technical solutions recorded in the foregoing embodiments or equivalent replacements may be done to some or all of the technical characteristics in the embodiments, and such modifications or replacements will not make the essence of corresponding technical solutions depart from the spirit and scope of the technical solutions in the embodiments of the present invention.

What is claimed is:

1. A system for compressing data, comprising:
   a smart meter to (a) collect electricity load data from a smart grid of a power system; (b) record the electricity load data collected at every time as where represents data point collected by the smart meter in the smart grid of the power system, and (c) represent total data points in the smart grid of the power system collected by the smart meter;
   a smart grid communication channel connected with the smart grid of the power system with for transmission of the electricity load data;
   a storage to store the electricity load data from the smart meter; and
   a processor configured to
   (i) LZ-compress in real time the electricity load data from the smart meter by a first compression process;
   (ii) LZ-encode the electricity load data, wherein the smart meter collects the electricity load data every preset first duration from the smart grid of the power system, and wherein the storage stores the LZ-encoded electricity load data in a temporary database through the smart grid communication channel after the first compression process;
   (iii) read the electricity load data from the temporary database every preset second duration, wherein the read electricity load data is electricity load data stored in the temporary database within the second duration before a corresponding reading time point; and
   (iv) (a) LZ-decode the read electricity load data, (b) SAX-compress in real time the LZ-decoded electricity load data by a second compression process, and (c) store the SAX-compressed electricity load data in a data center, thereby reducing transmission burden for communication lines and storage burden for the data center, and improving efficiency of electricity data analysis and service.

2. The system according to claim 1, wherein the second duration is longer than or equal to the first duration.

3. The system according to claim 1, wherein after LZ-decoding the read electricity load data, the processor is further configured to delete the electricity load data stored in the temporary database within the second duration before the corresponding reading time point.

4. The system according to claim 1, wherein the processor is specifically configured to determine a level of the LZ-decoded electricity load data based on a preset electricity load grading standard, and assign a character corresponding to the determined level to the LZ-decoded electricity load data.

* * * * *